(12) United States Patent  (10) Patent No.: US 7,852,120 B2
Aranovsky                 (45) Date of Patent:     Dec. 14, 2010

(54) BI-DIRECTIONAL BUFFER FOR OPEN-DRAIN OR OPEN-COLLECTOR BUS

(75) Inventor: Anatoly Aranovsky, Los Gatos, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/770,382

(22) Filed: Apr. 29, 2010

(65) Prior Publication Data

US 2010/0207661 A1   Aug. 19, 2010

Related U.S. Application Data

(63) Continuation of application No. 12/060,829, filed on Apr. 1, 2008, now Pat. No. 7,737,727.

(60) Provisional application No. 61/014,356, filed on Dec. 17, 2007, provisional application No. 61/024,476, filed on Jan. 29, 2008.

(51) Int. Cl.
    *H03K 19/0175* (2006.01)
(52) U.S. Cl. .............................. 326/83; 326/82; 326/86; 326/90
(58) Field of Classification Search .................. 326/86, 326/112, 115, 127, 82, 83, 90
    See application file for complete search history.

(56) References Cited

U.S. PATENT DOCUMENTS

| 4,695,740 | A | 9/1987 | Carter |
| 4,713,557 | A | 12/1987 | Carter |
| 4,835,418 | A | 5/1989 | Hsieh |
| 4,982,115 | A | 1/1991 | Lee |
| 5,079,693 | A | 1/1992 | Miller |
| 5,107,148 | A | 4/1992 | Millman |
| 5,107,507 | A | 4/1992 | Bland et al. |
| 5,132,987 | A | 7/1992 | Motohashi et al. |
| 5,173,619 | A | 12/1992 | Gaudenzi et al. |
| 5,214,330 | A | 5/1993 | Okazaki et al. |
| 5,214,638 | A | 5/1993 | Norz et al. |
| 5,248,908 | A | 9/1993 | Kimura |
| 5,295,246 | A | 3/1994 | Bischoff et al. |
| 5,300,835 | A | 4/1994 | Assar et al. |
| 5,381,062 | A | 1/1995 | Morris |
| 5,418,933 | A | 5/1995 | Kimura et al. |
| 5,428,649 | A | 6/1995 | Cecchi |
| 5,428,800 | A | 6/1995 | Hsieh et al. |
| 5,517,135 | A | 5/1996 | Young |
| 5,627,480 | A | 5/1997 | Young et al. |

(Continued)

OTHER PUBLICATIONS

"LTC4300A-1/LTC4300A-2:Hot Swappable 2-Wire Bus Buffers," © Linear Technology Corporation, Milpitas, CA (2001).

*Primary Examiner*—Vibol Tan
(74) *Attorney, Agent, or Firm*—Fliesler Meyer LLP

(57) ABSTRACT

Provided herein are bi-directional buffers, and methods for providing bi-directional buffering. In an embodiment, a bi-directional buffer includes a differential input/differential output amplifier that includes a first input/output node and a second/input output node. The differential input/differential output amplifier is configurable in a first configuration and a second configuration. When in the first configuration, the second input/output node follows the first input/output node. When in the second configuration, the first input/output node follows the second input/output node.

19 Claims, 7 Drawing Sheets

(configuration that causes node B to follow node A)

(configuration that causes node A to follow node B)

U.S. PATENT DOCUMENTS

| | | |
|---|---|---|
| 5,644,729 A | 7/1997 | Amini et al. |
| 5,715,405 A | 2/1998 | McClear et al. |
| 5,736,870 A | 4/1998 | Greason et al. |
| 5,790,526 A * | 8/1998 | Kniess et al. ............... 370/257 |
| 5,808,492 A | 9/1998 | Chow |
| 5,859,545 A | 1/1999 | Thornblad |
| 5,917,348 A | 6/1999 | Chow |
| 5,923,187 A | 7/1999 | Maugars |
| 6,046,605 A | 4/2000 | Ziemkowski et al. |
| 6,060,906 A | 5/2000 | Chow et al. |
| 6,075,384 A | 6/2000 | Sim et al. |
| 6,275,066 B1 | 8/2001 | Park et al. |
| 6,320,417 B1 * | 11/2001 | Kirsch et al. .................. 326/86 |
| 6,369,329 B1 * | 4/2002 | Moore ...................... 174/74 A |
| 6,513,090 B1 | 1/2003 | Jeddeloh |
| 6,597,198 B2 * | 7/2003 | Haycock et al. ............... 326/82 |
| 6,650,174 B2 | 11/2003 | Bell |
| 6,791,356 B2 * | 9/2004 | Haycock et al. ............... 326/82 |
| 6,822,480 B1 | 11/2004 | McCalmont |
| 6,834,318 B2 | 12/2004 | Hunter et al. |
| 6,842,806 B2 | 1/2005 | Ervin |
| 6,857,040 B2 | 2/2005 | Noonan et al. |
| 7,030,644 B2 * | 4/2006 | Feng ........................... 326/30 |
| 7,032,051 B2 | 4/2006 | Reay |
| 7,061,274 B2 | 6/2006 | George |
| 7,205,793 B2 | 4/2007 | George |
| 7,218,149 B2 | 5/2007 | Arai |
| 7,292,067 B2 | 11/2007 | Schwarz |
| 7,321,241 B1 | 1/2008 | Marak et al. |
| 7,348,803 B2 | 3/2008 | Bui et al. |
| 7,692,450 B2 * | 4/2010 | Aranovsky ................... 326/82 |
| 2008/0007300 A1 * | 1/2008 | Schwarz ...................... 326/80 |
| 2009/0295429 A1 * | 12/2009 | Hori ............................ 326/80 |

* cited by examiner

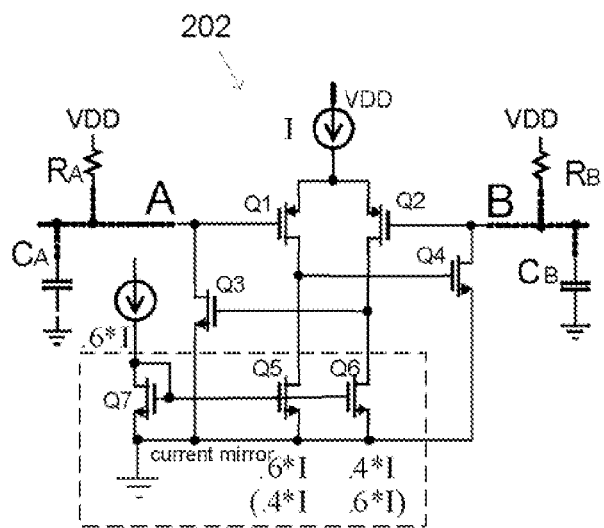
Fig. 2c
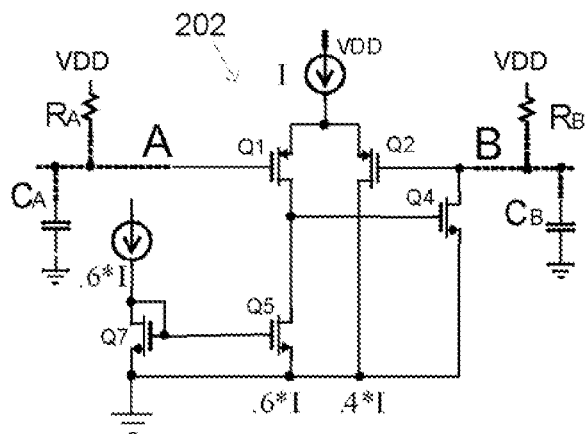
Fig. 3 (configuration that causes node B to follow node A)
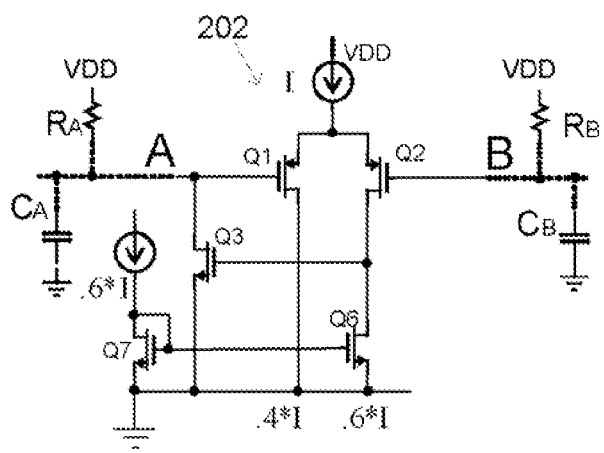
Fig. 4 (configuration that causes node A to follow node B)

BI-DIRECTIONAL BUFFER FOR OPEN-DRAIN OR OPEN-COLLECTOR BUS

PRIORITY CLAIM

This application is a continuation of U.S. patent application Ser. No. 12/060,829, filed Apr. 1, 2008, and claims priority under 35 U.S.C. 119(e) to U.S. Provisional Patent Application No. 61/014,356, filed Dec. 17, 2007, and U.S. Provisional Patent Application No. 61/024,476, filed Jan. 29, 2008. Each of the above applications is incorporated herein by reference.

BACKGROUND

An open drain bus, such as an Inter-Integrated Circuit (I2C) bus, a System Management Bus (SMBus), and others, usually includes a data line and a clock line. Such a data line and a clock line can each be referred to individually as a bus line, or simply as a line. As shown in FIG. 1a, each bus line (e.g., 101) is connected to a pull-up resistor R, pull down transistors Q1, Q2 and Q3 (each associated with an interface device) and a capacitance C. The capacitance C represents distributed capacitance of the bus line and the total input capacitance of interface devices 111, 112 and 113. Data transfer rate depends on how fast the resistor R can charge the capacitance C. To increase the maximum data transfer rate, a bus line 101 can be separated into segments (e.g., 101A, 101B and 101C), each having a reduced capacitance, as shown in FIG. 1b. FIG. 1b also shows that bi-directional buffers 102 can be used to transfer data between these segments. Existing bi-directional buffers are often susceptible to latch-up when the buffers are in a low logic state. To attempt to combat such latch-up, some buffers have introduced an input offset. However, such an input offset increases the input-to-output offset, which is undesirable. Accordingly, there is still a need for new bi-directional buffers that overcome at least some, and preferably all, of the deficiencies of existing bi-directional buffers.

SUMMARY

Embodiments of the present invention are related to bi-directional buffers, and methods for providing bi-directional buffering. In accordance with an embodiment of the present invention, a bi-directional buffer includes a differential input/differential output amplifier that includes a first input/output node and a second/input output node. The differential input/differential output amplifier is configurable in a first configuration and a second configuration. When in the first configuration, the second input/output node follows the first input/output node. When in the second configuration, the first input/output node follows the second input/output node.

Further and alternative embodiments, and the features, aspects, and advantages of the embodiments of invention will become more apparent from the detailed description set forth below, the drawings and the claims.

BRIEF DESCRIPTION OF THE DRAWINGS

FIG. 2c shows some additional details of the bi-direction buffer of FIG. 1a, according to an embodiment of the present invention.

FIG. 3 illustrates the buffer of FIG. 2c configured such that node B follows node A.

FIG. 4 illustrates the buffer of FIG. 2c configured such that node A follows node B.

DETAILED DESCRIPTION

Figure 1A:
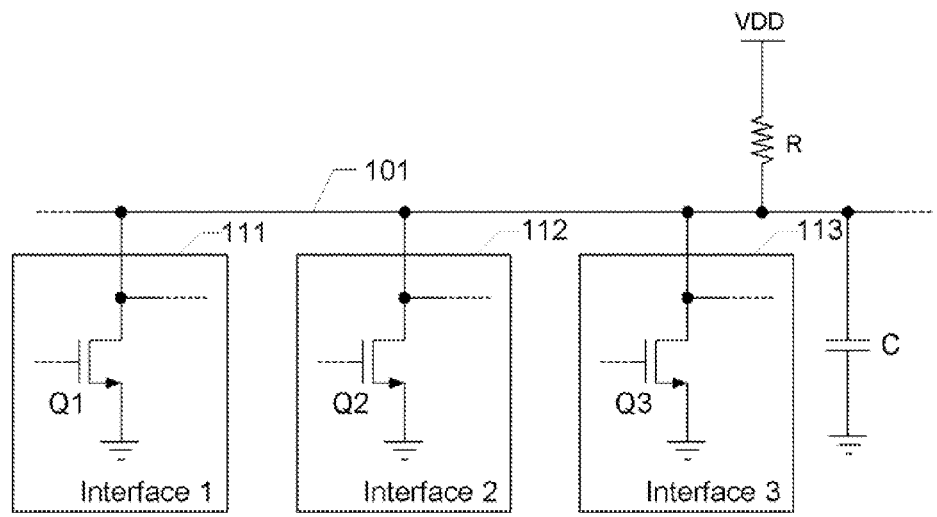
FIG. 1a illustrates an exemplary open-drain bus.
Figure 1B:
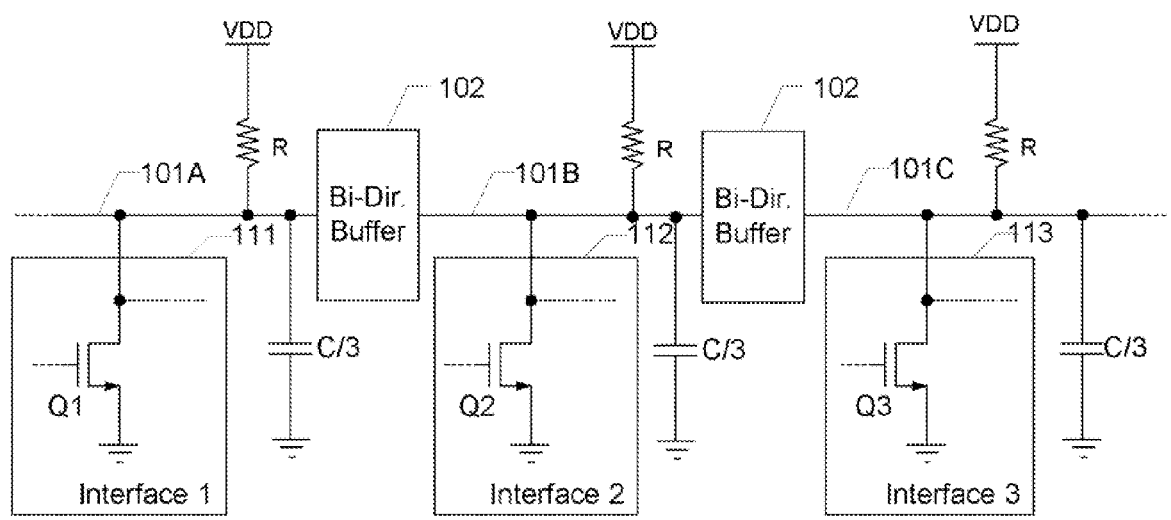
FIG. 1b illustrates how the exemplary open-drain bus of FIG. 1a can be separated into multiple segments.
Figure 2A:
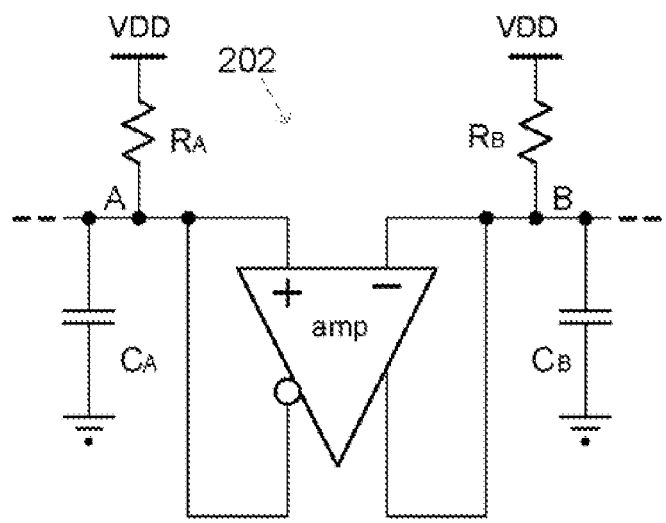
FIG. 2a illustrates a bi-direction buffer according to an embodiment of the present invention.

FIG. 2a illustrates a bi-direction buffer 202, according to an embodiment of the present invention. The buffer 202 is realized as a single differential input/differential output amplifier that changes its configuration depending on the direction of data flow. The differential input/differential output op-amp includes a first input/output node connected to a node A, and a second differential input/output node connected to a node B. Here nodes A and B represent bus line segments to be connected to the buffer 202. In other words, in this discussion, it is presumed that a bus line is divide into two segments, labeled A and B.

Resistors RA and RB are pull-up resistors that are external to the buffer 202. Capacitors CA and CB are illustrated to represent equivalent bus line capacitance and input capacitances of the interface devices associated with each bus line segment. The buffer 202 can be used, e.g., to interconnect two serial data line segments, or two clock line segments, but is not limited thereto. In FIGS. 2a-5c, the dashed lines connected to nodes A and B represent bus line segments A and B.

Figure 2B:
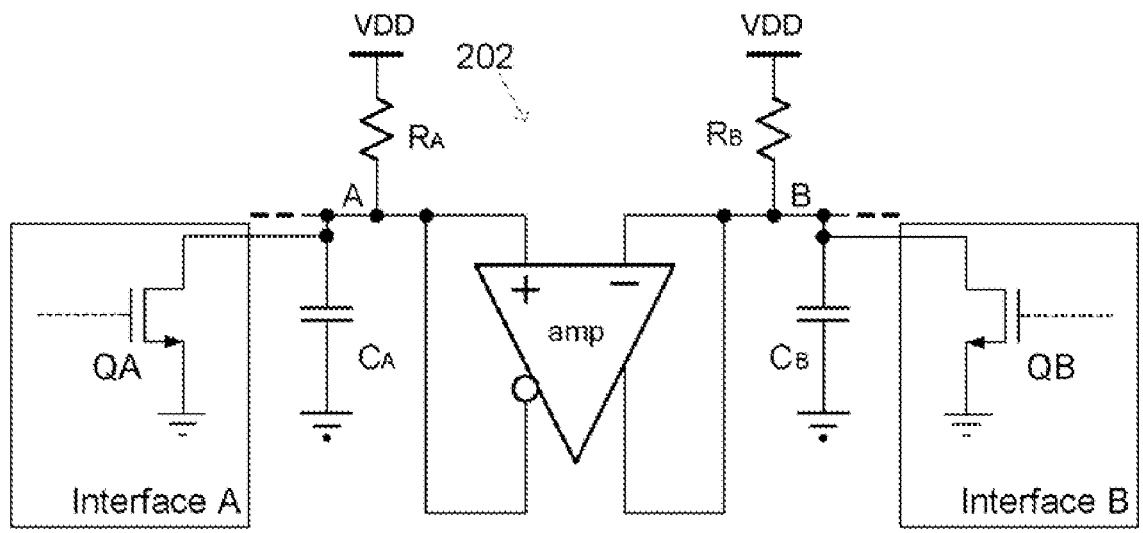
FIG. 2b illustrates the bi-directions buffer of FIG. 2a connected between two data bus line segments A and B.

FIG. 2b illustrates the bi-directions buffer 202 connected between two data bus line segments A and B and connecting two interface devices A and B. Open-drain transistor QA of interface device A is connected to the bus segment A. Pull-up resistor RA is connected between the bus segment A and a high voltage rail (VDD). Capacitor CA is connected between bus segment A and ground (GND). Similarly, open-drain transistor QB of interface device B is connected to the bus segment B. Pull-up resistor RB is connected between the bus segment B and VDD. Capacitor CB is connected between bus segment B and GND. Transistors QA and QB can alternatively be connected as open-collector devices, if transistors QA and QB are bipolar transistors (BJTs), instead of MOSFETs.

In one example, the bi-directional buffer 202 can be used to connect a printed circuit board (PCB) card (e.g., an I/O card) with a system backplane. For example, node A can represent a single data line (SDA) of a system backplane, and node B can be a SDA line of an I/O card. This is just an example, which is not meant to be limiting. Values of resistors RA and RB are selected to achieve an acceptable compromise between power dissipation and bus speed.

In accordance with specific embodiments of the present invention, when node A is brought down (e.g., by an external interface device), the bi-directional buffer 202 will bring down node B. Similarly, when node B is brought down, the bi-directional buffer 202 acts to bring down node A, thus providing bi-directional capability. Transitions from low to high are propagated in either direction in the same way. Bringing a node down refers to changing a node from a logic 1 state to a logic 0 state. Referring to FIG. 2b, node A can be brought down when interface device A turns on NMOS transistor QA. Similarly, node B can be brought down when interface device B turns on NMOS transistor QB.

FIG. 2c shows some additional details of the buffer 202, according to an embodiment of the present invention. Referring to FIG. 2c, the bi-directional buffer 202 is shown as including a pair of PMOS transistors Q1 and Q2 connected as a differential input pair, a tail current source I (which generates a current I), output stage NMOS transistors Q3 and Q4, and active load NMOS transistors Q5 and Q6 that form a current mirror along with NMOS transistor Q7. Transistors Q5 and Q6 may also be referred herein to as current sink transistors. The sources of transistors Q5, Q6 and Q7 are shown as being connected to ground. The gate of transistor Q1 provides the first input/output node of the differential input/differential output op-amp, and the gate of transistor Q2 provides the second input/output node of the differential input/differential output op-amp.

Transistors Q5, Q6 and Q7 form a current mirror having one input and two outputs. The common input of the current mirror is provided at the drain of transistor Q7, and the two outputs of the current mirror are provided at the drains of the active load transistors Q5 and Q6. In the Figs., each active load transistor Q5 and Q6 is shown as being set to sink current equal to 60% of the tail current I. Since the sum of the sink currents exceeds the available tail current I, only one load (transistor Q5 or Q6) will be active at a time. The other load (transistor Q5 or Q6) will collapse (since only 40% of tail current is available) and short the gate of one of the output devices (transistor Q3 or Q4). More generally, each active load transistor Q5 and Q6 is set to sink a current equal to P*I, where the coefficient P represents a portion or fraction of the tail current, and P>0.5. This will result in only one of the loads Q5 and Q6 being active at one time, while the other load collapses because it does not receive enough current. In the example discussed herein, P=0.6, but other values are within the scope of the present invention. For another example, P=0.7. There are many different types of current mirrors that can be used, other than the simple type illustrated. Such current mirrors will have one input and two outputs, where only one output is active at a time, while the other collapses. Use of such alternative current mirrors is also within the scope of the present invention.

The bi-directional buffer 202 operates as follows. Suppose initially both nodes A and B are high, i.e., have a HIGH voltage level, corresponding to a logic level 1. Exemplary HIGH voltage levels are +5V or +3.3V, but are not limited thereto. When nodes A and B are both high, both transistors Q1 and Q2 are turned off, as are transistors Q3 and Q4. Thus, nodes A and B are disconnected when nodes A and B are both high.

Now, suppose node A is brought down to a LOW voltage level, corresponding to a logic level 0, e.g., by an external interface device connected to node A. An exemplary LOW voltage level is ground (GND), but other levels, such as −3.3V or −5V are possible. When the voltage at the gate of transistor Q1 is low enough, the tail current source I becomes active and provides current to the differential pair of transistors Q1 and Q2. Since the voltage at the gate of transistor Q1 is lower than the voltage at the gate of transistor Q2, the drain current of transistor Q1 sets at a 60%*I level. This leaves only 40% of the current I available to transistors Q2 and Q6 (i.e., the drain current of transistor Q2 sets at a 40%*I level). As a result, transistor Q6 will be in triode mode (where its drain voltage is close to its source voltage), which will result in the shorting of the gate of transistor Q3 to ground (thus turning off transistor Q3), causing the bi-directional buffer 202 to attain the configuration shown in FIG. 3. Referring to FIG. 3, in this configuration the bi-directional buffer 202 will serve as a follower and will make node B follow node A.

Similarly, if node B is brought down (e.g., by an external interface device B), the bi-directional buffer 202 will re-configure itself to attain the configuration depicted in FIG. 4. This configuration results from transistor Q5 being put into triode mode, which results in the shorting of the gate of transistor Q4 to ground (thus turning off transistor Q4). Referring to FIG. 4, in this configuration the bi-directional buffer 202 will act as a follower and will make node A follow node B.

In the above described manner, the bi-directional buffer 202 facilitates bi-directional data transfer by re-configuring itself according to the direction of data flow. A benefit of the bi-directional buffer 202 is that it not susceptible to latch-up, since there is only one amplifier and only one feedback loop (of two possible feedback loops) active at a time.

In summary, the bi-direction buffer 202 has two configuration states, which depend on the data transfer direction, and may also depend on time constants. When node A is pulled down externally, the first configuration state (FIG. 3) is attained, and the buffer pulls down node B. When node B is pulled down externally, the second configuration state (FIG. 4) is attained, and buffer pulls node A down. Thus, bi-directional transfer of high-to-low transition occurs.

Bi-directional transfer of low-to-high transition occurs as follows. Suppose initially node A is pulled down by external interface device A so that the first configuration state (FIG. 3) results. When node A is released, two scenarios are possible. In the first scenario, where $\tau A > \tau B$, node B will tend to rise faster than node A, the voltage potential at the gate of transistor Q2 will be higher than at the gate of transistor Q1, the circuit will remain in the same configuration state, and the faster node B will follow the slower node A. The circuit will stay in the same configuration state (FIG. 3) until transistors Q1 and Q2 are conducting. When nodes A and B are high enough to turn off transistors Q1 and Q2, the nodes will continue to rise independently, each with its own time constant. In the second scenario, where $\tau A < \tau B$, node A will tend to rise faster than node B, causing the voltage potential at the gate of transistor Q1 to be higher than at the gate of transistor Q2, at which point the circuit will switch from the first configuration (FIG. 3) into the second configuration (FIG. 4). Now faster node A will follow slower node B. And again, when transistors Q1 and Q2 are turned off, the nodes will raise independently—each with its own time constant. Similar action takes place, when node B is pulled down and then released, thus achieving bi-directional transfer of low-to-high transition.

The bi-directional buffer 202 of FIG. 2c does not provide rail-to-rail operation, meaning nodes A and B are sometimes disconnected (i.e., when nodes A and B approach VDD). To accomplish rail-to-rail operation, if desired, the circuit of FIG. 2c can be modified accordingly to provide the bi-directional buffer 502 of FIG. 5a. More specifically, transistors Q8-Q16 can be added to the circuit of FIG. 2c, as shown in FIG. 5a, which results in nodes A and B always being connected to one another throughout rail-to-rail operation.

Figure 5A:
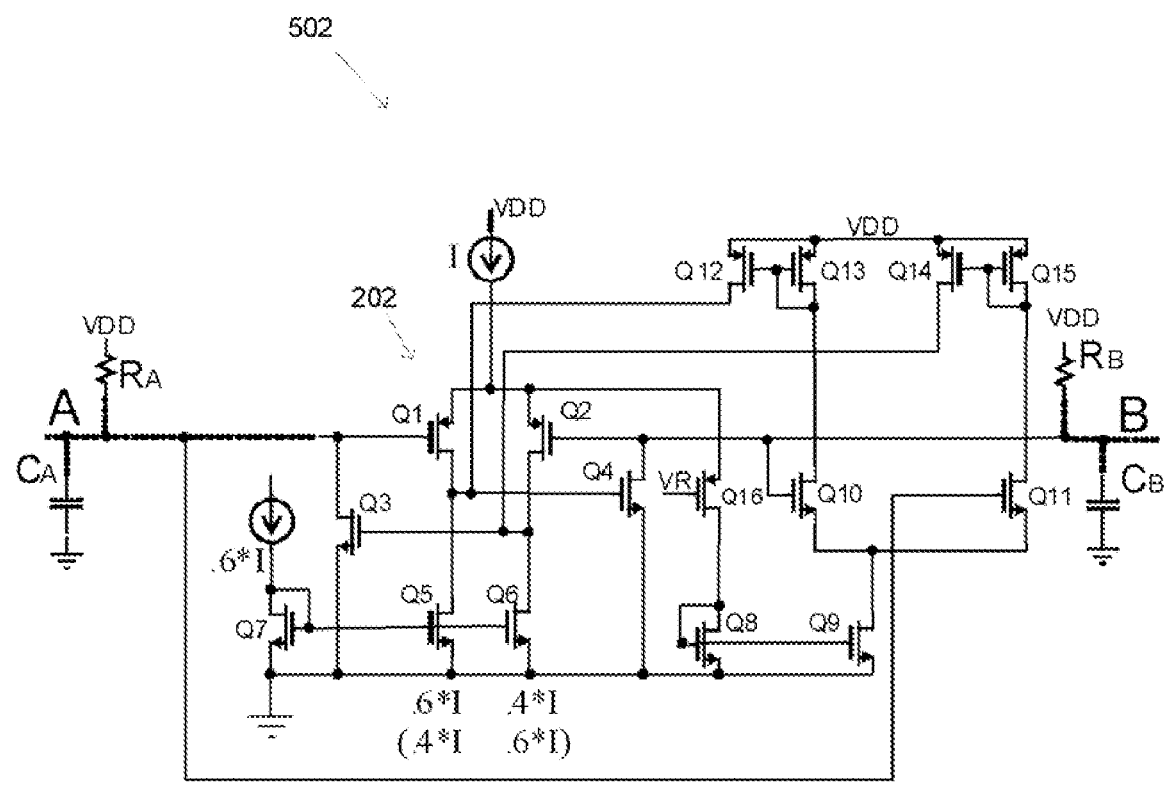
FIG. 5a illustrates a modification to the bi-direction buffer of FIG. 2a that enables rail-to-rail operation.

Referring to FIG. 5a, transistor Q16 serves as a current switch which diverts tail current from the PMOS differential pair Q1 and Q2 as their gate voltage potentials approach a reference voltage (VR) moving closer to VDD. This tail current feeds the differential pair of NMOS transistors Q10 and Q11 which provides essentially the same function as transistors Q1 and Q2 while operating at VA and VB close (or equal) to VDD, where VA is the voltage at node A, and VB is the voltage at node B.

Referring to FIG. 5a, the PMOS differential pair of transistors Q1 and Q2 will start to turn off when voltages VA and VB reach a voltage approximately equal to VR. Here, the added NMOS differential pair of transistors Q10 and Q11 will take over when transistors Q1 and Q2 turn off, and transistors Q10 and Q11 will operate all the way up to VDD.

The reference voltage VR is set somewhere between VDD and GND. Suppose initially nodes A and B are at GND, transistor Q16 is off and transistors Q1 and Q2 are on. If either of the nodes A or B is released the other node will follow it rising from GND to VDD (as described above). When nodes A and B rise high enough (approximately to VR), their common source connection potential rises as well, turning on transistor Q16. Transistor Q16 diverts part of tail current I into the differential amplifier including transistors Q10 and Q11. When nodes A and B rise sufficiently above VR, transistors Q1 and Q2 turn off and all of the tail current I is diverted to transistors Q10 and Q11. At this point, the differential amplifier including transistors Q10 and Q11 and the current mirror formed by transistors Q12-15 replaced the amplifier including transistors Q2 and Q1 and the current mirror formed by transistors Q5-Q7, preserving functionality.

Figure 5B:
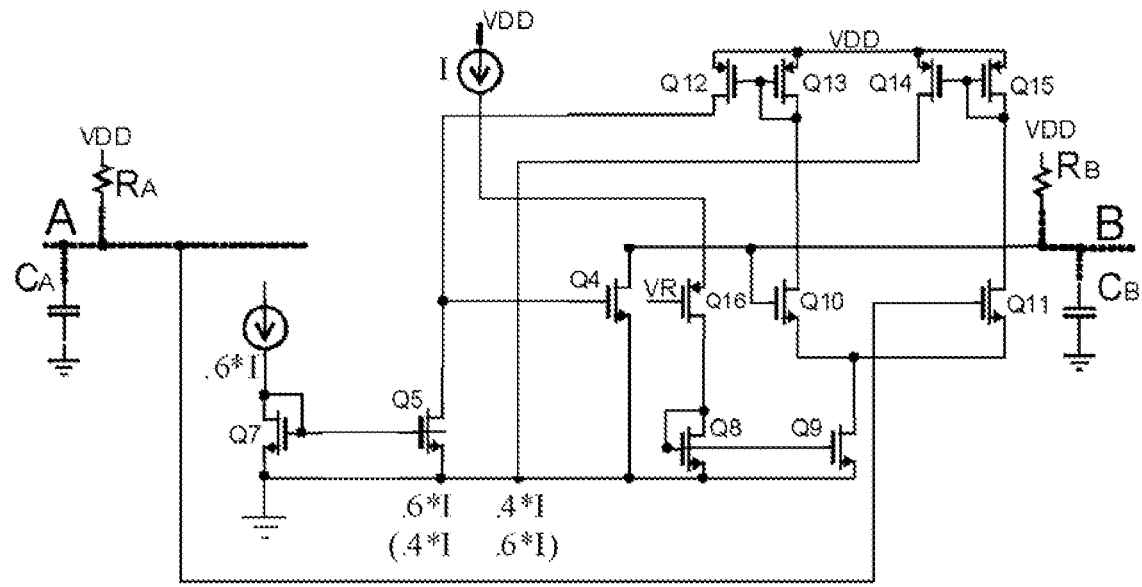
FIGS. 5b and 5c are used to explain how the circuit of FIG. 5a functions depending upon the magnitude of the voltage levels at nodes A and B.
Figure 5C:
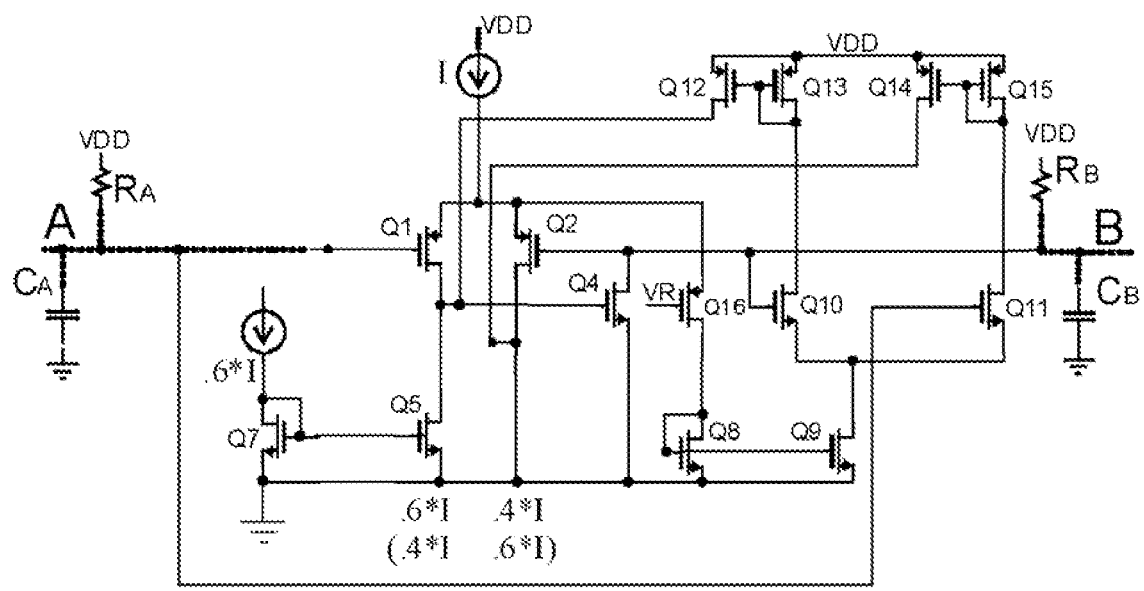

The bi-directional rail-to-rail buffer 502 can be explained in more detail with reference to FIGS. 5b and 5c, which are used to show possible configurations of the buffer 502 of FIG. 5a. Suppose that both nodes A and B are rising and the circuit attains state 1 (as discussed with reference to FIG. 3), i.e. node A is lower than node B, and node B follows node A. As the nodes rise, transistors Q1 and Q2 will turn off and transistor Q9 will supply tail current to the differential pair of transistors Q10 and Q11. Since node B is higher, transistor Q10 will get a larger portion of the tail current (as compared to transistor Q11). This portion of the current will be mirrored to the drain of transistor Q5. Thus, transistor Q5 will stay active, transistor Q6 will remain in triode mode and the circuit will attain the configuration of FIG. 5b. This configuration is equivalent to FIG. 3, as far as external nodes A and B are concerned. When voltages VA and VB are high enough to turn on transistor Q16, but not high enough to turn off transistors Q1 and Q2, the circuit will attain the configuration of FIG. 5c, which is also equivalent to FIG. 3 as far as external nodes A and B are concerned.

Figure 6:
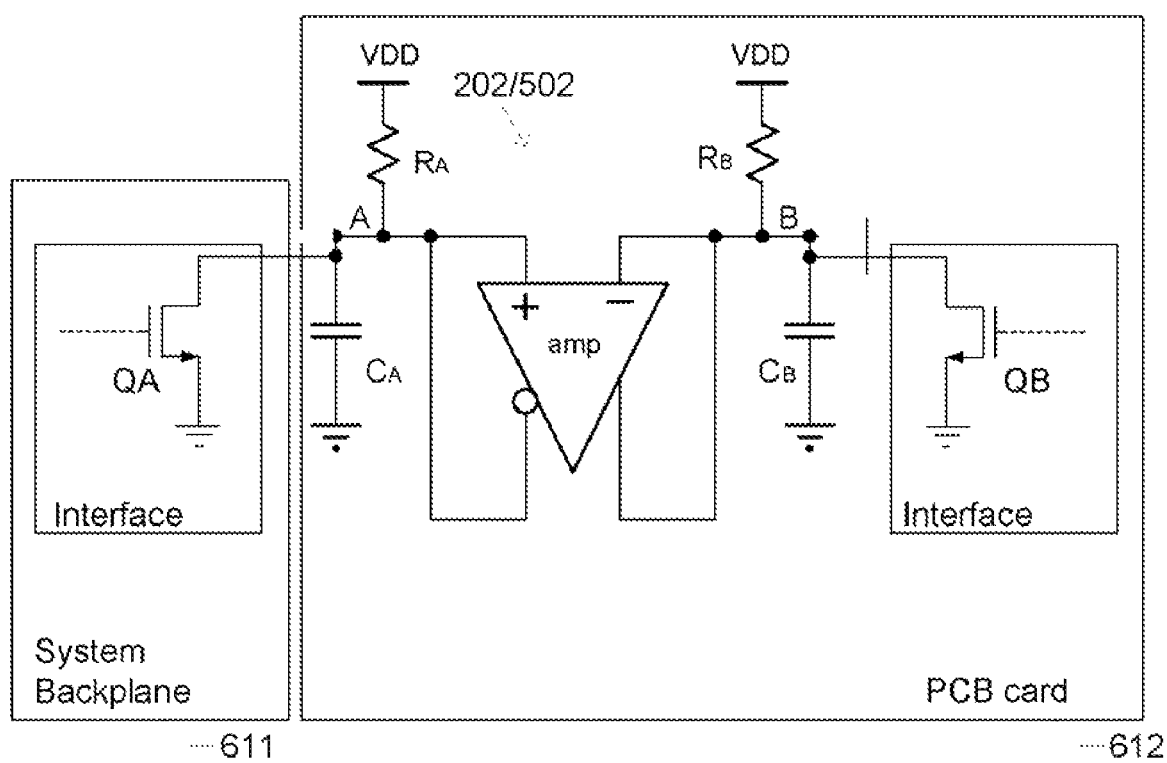
FIG. 6 illustrates a system including a bi-direction buffer of an embodiment of the present invention interconnecting two bus line segments, where an interface device of a PCB card is connected to one of the bus line segments and an interface device of a system backplane is connected to the other bus line segment.

The bi-direction buffers of embodiments of the present invention can be used to interconnect segments of bus lines. Exemplary types of buses in which embodiments of the present invention can be used include, e.g., I2C and SMBus, but are not limited thereto. Referring to FIG. 6, the buffers 202 and 502 of the present invention can be used, e.g., for interconnecting a PCB card 612 with a system backplane 611. In such a case, as shown in FIG. 6, the bi-directional buffer 202 or 502 can be built onto the PCB card 612. More generally, the buffers of the present invention can be used to interconnect devices that include open-drain or open-collector circuitry for driving a bus line.

In embodiments of the present invention described above, with reference to the Figs., circuits were shown as including MOS type transistors. However, in other embodiments the circuits need not be made from MOS devices, but can include other types of devices, such as BJTs or MES devices. For example, transistors Q1-Q15 can be BJT transistors.

Figure 7:
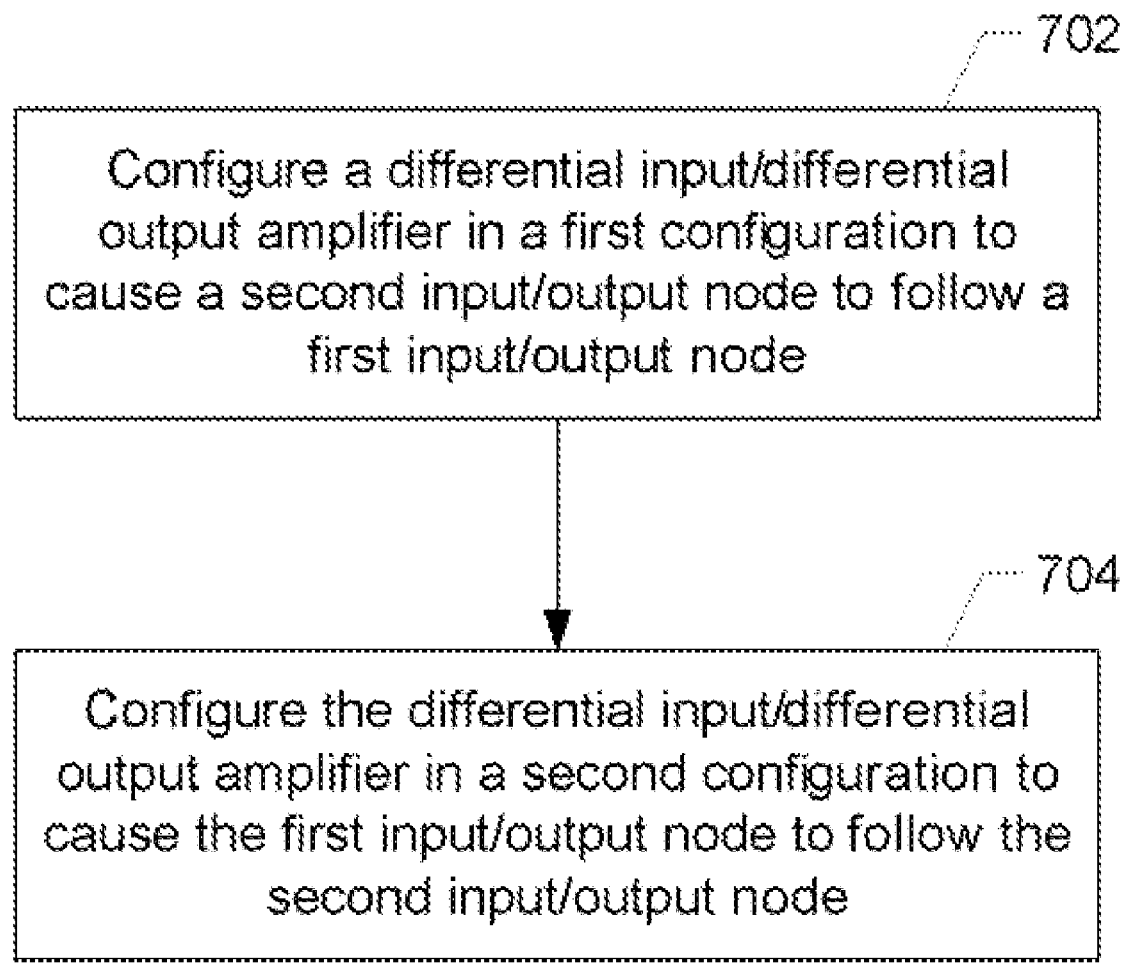
FIG. 7 is a high level flow diagram that is used to describe a method according to an embodiment of the present invention.

A method for bi-directional buffering, according to an embodiment of the present invention, shall now be described with reference to the high level flow diagram of FIG. 7. Referring to FIG. 7, at step 702, a differential input/differential output amplifier (e.g., 202 or 502) is configured in a first configuration to cause a second input/output node (e.g., node B in FIGS. 2a-6) to follow a first input/output node (e.g., node A in FIGS. 2a-6). At step 704, the differential input/differential output amplifier is configured in a second configuration to cause the first input/output node (e.g., node A in FIGS. 2a-6) to follow the second input/output node (e.g., node B in FIGS. 2a-6). For example, referring back to FIGS. 2c, 3 and 4, the bi-direction buffer 202 is configured in a first configuration in FIG. 3, and in a second configuration in FIG. 4.

Another way of viewing embodiments of the present invention is that a differential input amplifier includes first and second inputs (e.g., connected to nodes A and B respectively in FIGS. 2a-2c) and first and second outputs, yet only one of the first and second outputs is active at one time, with the other being inactive. The active output is connected to its corresponding input, and the inactive output is disconnected from its corresponding input, as can be appreciated from FIGS. 3 and 4. The second input follows the first input when the second output is active (e.g., as can be appreciated from FIG. 3). The first input follows the second input when the first output is active (e.g., as can be appreciated from FIG. 4).

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A bi-directional buffer, comprising:
   a pair of p-channel input transistors (Q1 and Q2) connected as a differential input pair, wherein a control terminal (gate or base) of a first one of the p-channel input transistors (Q1) provides a first input/output node (node A) of the bi-direction buffer, and a control terminal (gate or base) of a second one of the p-channel input transistors (Q2) provides a second input/output node (node B) of the bi-direction buffer; and
   a pair of n-channel output stage transistors (Q3 and Q4);
   wherein a current path terminal (drain or collector) of the first one of the n-channel output stage transistors (Q3) is connected to the first input/output node (node A); and
   wherein a current path terminal (drain or collector) of the second one of the n-channel output stage transistors (Q4) is connected to the second input/output node (node B);
   wherein when the first input/output node (node A) is pulled toward a low voltage rail, a control terminal (gate or base) of a first one of the n-channel output stage transistors (Q3) is also pulled toward the low voltage rail and is turned off, resulting in the second input/output node (node B) following the first input/output node (node A); and
   wherein when the second input/output node (node B) is pulled toward the low voltage rail, a control terminal (gate or base) of a second one of the n-channel output stage transistors (Q4) is also pulled toward the low voltage rail and is turned off, resulting in the first input/output node (node A) following the second input/output node (node B).

2. The bi-directional buffer of claim 1, further comprising:
a pair of n-channel input transistors (Q11 and Q10) connected as a further differential input pair, wherein a control terminal (gate or base) of a first one of the pair of n-channel input transistors (Q11) is a connected to the first input/output node (node A) of the bi-direction buffer, and a control terminal (gate or base) of a second one of the pair of n-channel input transistors (Q10) is connected to the second input/output node (node B) of the bi-direction buffer;
wherein while the first input/output node (node A) and the second input/output node (node B) are being pulled up from the low voltage rail towards the high voltage rail, the pair of p-channel input transistors (Q1 and Q2) are turned off, and the pair of n-channel input transistors (Q11 and Q10) are turned on, as part of rail-to-rail operation of the bi-directional buffer.

3. The bi-direction buffer of claim 2, further comprising:
a current steering transistor (Q16) including a control terminal (gate or base) that receives a reference voltage (VR) that specifies when the pair of p-channel input transistors (Q1 and Q2) start to turn off and the pair of n-channel input transistors (Q11 and Q10) start to turn on.

4. The bi-directional buffer of claim 2, wherein:
the pair of n-channel output stage transistors (Q3 and Q4) that are both turned on when the first input/output node (node A) and the second input/output node (node B) are pulled up toward a high voltage rail.

5. The bi-directional buffer of claim 1, further comprising:
a current mirror that helps control whether it is the control terminal (gate or base) of the first one of the n-channel output stage transistors (Q3) or the second one of the n-channel output stage transistors (Q4) that is pulled toward the low voltage rail and turned off.

6. The bi-directional buffer of claim 5, further comprising:
a current source;
wherein the current mirror includes an input and two outputs;
wherein the current source that provides a current, to the input of the current mirror, that is sufficient to enable only one of the outputs of the current mirror to be active at a time;
wherein a first one of the outputs of the current mirror is connected to the control terminal (gate or base) of the first one of the n-channel output stage transistors (Q3);
wherein a second one of the outputs of the current mirror is connected to the control terminal (gate or base) of the second one of the n-channel output stage transistors (Q4);
wherein when the current source causes only the second one of the outputs of the current mirror to be active, the first one of the n-channel output stage transistors (Q3) is turned off, which causes the second input/output node (node B) to follow the first input/output node (node A); and
wherein when the current source causes only the first one of the outputs of the current mirror to be active, the second one of the n-channel output stage transistors (Q4) is turned off, which causes the first input/output node (node A) to follow the second input/output node (node B).

7. The bi-directional buffer of claim 6, wherein each of the two outputs of the current mirror is provided by a corresponding transistor, and wherein the transistor that provides the active output of the current mirror is turned on, and the transistor that provides the output of the current mirror that is not active is in triode mode.

8. The bi-directional buffer of claim 5, further comprising:
a pair of n-channel input transistors (Q11 and Q10) connected as a further differential input pair, wherein a control terminal (gate or base) of a first one of the pair of n-channel input transistors (Q11) is a connected to the first input/output node (node A) of the bi-direction buffer, and a control terminal (gate or base) of a second one of the pair of n-channel input transistors (Q10) is connected to the second input/output node (node B) of the bi-direction buffer;
wherein while the first input/output node (node A) and the second input/output node (node B) are being pulled up from the low voltage rail towards the high voltage rail, the pair of p-channel input transistors (Q1 and Q2) are turned off, and the pair of n-channel input transistors (Q11 and Q10) are turned on, as part of rail-to-rail operation of the bi-directional buffer.

9. The bi-direction buffer of claim 8, further comprising:
at least one further current mirror that, while the pair of p-channel input transistors (Q1 and Q2) are turned off and the pair of n-channel input transistors (Q11 and Q10) are turned on, helps control whether it is the control terminal (gate or base) of the first one of the n-channel output stage transistors (Q3) or the second one of the n-channel output stage transistors (Q4) that is pulled toward the low voltage rail and turned off.

10. The bi-directional buffer of claim 9, wherein:
a current path terminal (drain or collector) of the first one of the n-channel output stage transistors (Q3) is connected to the first input/output node (node A); and
a current path terminal (drain or collector) of the second one of the n-channel output stage transistors (Q4) is connected to the second input/output node (node B).

11. A bi-directional buffer, comprising:
a differential input amplifier including
a pair of p-channel input transistors (Q1 and Q2),
a pair of n-channel input transistors (Q11 and Q10), and
a pair of n-channel output transistors (Q3 and Q4);
wherein control terminals (gates or bases) of a first one of the pair of p-channel input transistors (Q1) and a first one of the pair of n-channel input transistors (Q11) are connected together and provide a first input/output node (node A) of the bi-direction buffer;
wherein control terminals (gates or bases) of a second one of the pair of p-channel input transistors (Q2) and a second one of the pair of n-channel input transistors (Q10) are connected together and provide a second input/output node (node B) of the bi-direction buffer;
wherein the pair of n-channel output stage transistors (Q3 and Q4) are both turned on when the first input/output node (node A) and the second input/output node (node B) are pulled up toward the high voltage rail;
wherein when the first input/output node is pulled toward the low voltage rail, the control terminal (gate or base) of a first one of the n-channel output stage transistors (Q3) is also pulled toward the low voltage rail and is turned off, resulting in the second input/output node (node B) following the first input/output node (node A); and
wherein when the second input/output node (node B) is pulled toward the low voltage rail, a control terminal (gate or base) of a second one of the n-channel output stage transistors (Q4) is also pulled toward the low voltage rail and is turned off, resulting in the first input/output node (node A) following the second input/output node (node B).

12. The bi-directional buffer of claim 11, wherein while the first input/output node (node A) and the second input/output node (node B) are being pulled up from a low voltage rail towards a high voltage rail, the pair of p-channel input transistors (Q1 and Q2) are turned off, and the pair of n-channel input transistors (Q11 and Q10) are turned on, as part of rail-to-rail operation of the bi-directional buffer.

13. The bi-directional buffer of claim 11, further comprising:
current mirrors that help control whether it is the control terminal (gate or base) of the first one of the n-channel output stage transistors (Q3) or the second one of the n-channel output stage transistors (Q4) that is pulled towards the low voltage rail and turned off.

14. The bi-direction buffer of claim 13, further comprising:
a current steering transistor (Q16) including a control terminal (gate or base) that receives a reference voltage (VR) that specifies when the pair of p-channel input transistors (Q1 and Q2) start to turn off and the pair of n-channel input transistors (Q11 and Q10) start to turn on.

15. The bi-directional buffer of claim 12, wherein the low voltage rail is connected to ground or to a negative voltage supply.

16. The bi-directional buffer of claim 12, wherein:
a current path terminal (drain or collector) of the first one of the n-channel output stage transistors (Q3) is connected to the first input/output node; and
a current path terminal (drain or collector) of the second one of the n-channel output stage transistors (Q4) is connected to the second input/output node.

17. A method for bi-directional buffering, comprising:
(a) providing a pair of p-channel input transistors (Q1 and Q2) and a pair of n-channel input transistors (Q11 and Q10) such that control terminals (gates or bases) of a first one of the pair of p-channel transistors (Q1) and a first one of the pair of n-channel input transistors (Q11) are connected together to provide a first input/output node (node A), and control terminals of a second one of the pair of p-channel transistors (Q2) and a second one of the pair of n-channel input transistors (Q10) are connected together and provide a second input/output node (node B);
(b) providing a pair of n-channel output transistors (Q3 and Q4);
(c) using the pair of p-channel input transistors (Q1 and Q2) and the pair of output transistors (Q3 and Q4) to provide bi-directional buffering between the first and second input/output nodes, when voltage potentials at the first and second input/output nodes are between a low voltage rail and a reference voltage; and
(d) using the pair of n-channel input transistors (Q11 and Q10) and the pair of output transistors (Q3 and Q4) to provide bi-directional buffering between the first and second input/output nodes, when voltage potentials at the first and second input/output nodes are between the reference voltage and a high voltage rail.

18. The method of claim 17, wherein:
step (c) includes turning on the pair of p-channel input transistors (Q1 and Q2) and turning off the pair of n-channel input transistors (Q11 and Q10); and
step (d) includes turning off the pair of p-channel input transistors (Q1 and Q2) and turning on the pair of n-channel input transistors (Q11 and Q10).

19. The bi-direction buffer of claim 17, further comprising using a current steering transistor (Q16) including a control terminal (gate or base) that receives the reference voltage to specify when step (c) is performed, and when step (d) is performed.

* * * * *